(12) United States Patent
Ganai et al.

(10) Patent No.: US 6,473,884 B1
(45) Date of Patent: Oct. 29, 2002

(54) METHOD AND SYSTEM FOR EQUIVALENCE-CHECKING COMBINATORIAL CIRCUITS USING INTERATIVE BINARY-DECISION-DIAGRAM SWEEPING AND STRUCTURAL SATISFIABILITY ANALYSIS

(75) Inventors: Malay Kumar Ganai, Austin, TX (US); Geert Janssen, Putnam Valley, NY (US); Florian Karl Krohm, Red Hook, NY (US); Andreas Kuehlmann, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/524,890

(22) Filed: Mar. 14, 2000

(51) Int. Cl.[7] .............................................. G06F 17/50
(52) U.S. Cl. ..................... 716/3; 716/2; 716/3; 716/5; 716/6; 716/17; 716/19
(58) Field of Search ........................... 716/1–5, 17, 18, 716/6, 19

(56) References Cited

U.S. PATENT DOCUMENTS

| | | | | |
|---|---|---|---|---|
| 4,942,536 A | * | 4/1986 | Watanabe et al. | 364/490 |
| 5,243,538 A | * | 8/1990 | Okuzawa et al. | 364/489 |
| 5,331,568 A | * | 6/1991 | Pixley | 364/489 |
| 5,469,367 A | * | 6/1994 | Puri et al. | 364/489 |
| 5,638,381 A | * | 7/1995 | Cho et al. | 371/22.4 |
| 5,671,399 A | * | 7/1995 | Meier | 395/500 |
| 5,909,374 A | * | 8/1996 | Matsunaga | 364/488 |
| 5,949,691 A | * | 8/1997 | Kurosaka et al. | 364/489 |
| 5,974,242 A | * | 9/1997 | Damaria et al. | 395/500.03 |
| 5,754,454 A | | 5/1998 | Pixley et al. | 364/580 |
| 6,026,222 A | * | 2/2000 | Gupta et al. | 395/500.26 |
| 6,035,107 A | * | 3/2000 | Kuehlmann et al. | 395/500.02 |
| 6,086,626 A | * | 7/2000 | Jain et al. | 716/5 |
| 6,308,299 B1 | * | 10/2001 | Burch et al. | 716/4 |

OTHER PUBLICATIONS

"GRASP—A New Search Algorithm for Satisfiability," Joao P. Marques Silva and Karem A. Sakallah, The University of Michigan, Computer and Science and Engineering Division, CSE–TR–292–96, Apr. 10, 1996, pp. 1–17.

T. Larrabee, "Test pattern generation using boolean satisfiability" IEEE Trans. on computer–aided design of IC's vol. 11 No. 1 Jan. 1992 pp. 4–15.*

Stephan et al., "Combinational test generation using satisfiability" IEEE Trans. on computer–aided design of IC's vol. 15 No. 9 Sep. 1996 pp. 11671176.*

Hulgaard et al., "Equivalence checking of combinational circuits using boolean expression diagrams" IEEE Trans on computer–aided design . . . vol. 18 No. 7 Jul. 1999 pp. 903–917.*

\* cited by examiner

*Primary Examiner*—Matthew Smith
*Assistant Examiner*—Granville D. Lee
(74) *Attorney, Agent, or Firm*—Casimer K. Salys; Bracewell & Patterson, L.L.P.

(57) ABSTRACT

A method and system for equivalence checking of logical circuits using iterative circuit reduction and satisfiability techniques provide improved performance in computer-based verification and design tools. By intertwining a structural satisfiability solver and binary decision diagram functional circuit reduction method, computer-based tools can make more efficient use of memory and decrease computation time required to equivalence check large logical networks. Using the circuit reduction technique back-to-back with the simulation technique, optimum local and global circuit reduction are simultaneously achieved. By iterating between the structural and functional techniques, and adjusting the size of sub-networks being analyzed within a larger network, sub-networks can be reduced or eliminated, decreasing the amount of memory required to represent the next larger inclusive network.

21 Claims, 5 Drawing Sheets

$O = !(A \cdot B) \cdot C$

METHOD AND SYSTEM FOR EQUIVALENCE-CHECKING COMBINATORIAL CIRCUITS USING INTERATIVE BINARY-DECISION-DIAGRAM SWEEPING AND STRUCTURAL SATISFIABILITY ANALYSIS

BACKGROUND OF THE INVENTION

1. Technical Field

The present invention generally relates to systems for equivalence checking of logical circuits such as verifiers and design tools, and more particularly to a computer program for equivalence checking large networks of logical circuits, wherein structural analysis and functional analysis are intertwined to improve analysis efficiency.

2. Description of the Related Art

Logic circuit synthesis and verification tools are typically required to represent integrated circuits having ten million transistors or more, such as microprocessors and Very-Large-Scale-Integration (VLSI)circuits. This level of integration represents millions of logic gates and their interconnections. A large amount of memory is required to represent and simulate the behavior of this many gates and sets a limitation on the complexity of simulation or the minimum system memory required to simulate or create a design using workstation software. Equivalence-checking is performed to find circuit equivalence between designs and to verify that networks meet their design specification, such as Very High Level Description Language(VHDL)input.

Algorithms that compare logic circuits that exhaustively analyze every input combination or structural feature are not as efficient as algorithms that can reduce search spaces while verifying a design. Large amounts of memory and processing power are required to represent large logical circuits while analyzing their structure or simulating their behavior in an exhaustive manner.

When performing equivalence checking of two circuits, there are usually many sub-circuits that will be the same for each circuit. The complexity of equivalence checking in large circuits may be reduced by merging equivalent nodes via functional analysis such as the Binary Decision Diagram (BDD) techniques described in "METHOD FOR DETERMINING FUNCTIONAL EQUIVALENCE BETWEEN DESIGN MODELS" U.S. Pat. No. 5,754,454, which is incorporated herein by reference. Likewise, structural satisfiability (SAT) solvers such as those described by "GRASP—A New Search Algorithm for Satisfiability" University of Michigan publication CSE-TR-292-96, can be used to find input combinations such that the non-equivalence of two circuits is proved. Each of these techniques has its pitfalls. BDD analysis may use a large amount of memory for circuits that are implementing certain functions. The SAT solvers are less demanding of memory resources, but can take a much longer time to complete for large circuits, and the completion time is dependent on the particular logical functions performed by the circuit. Thus, a priori determination of comparison time using a SAT solver cannot be made.

Therefore, it is desirable to implement an improved verification algorithm that can overcome the limitations of SAT solvers and BDD analyzers.

SUMMARY OF THE INVENTION

The objective of improving performance of a verification tool is achieved by comparing a first logical circuit to a second logical circuit via the construction of a combined circuit graph representing said first circuit and the second circuit. Then, binary decision diagrams (BDDs) for nodes within the combined circuit graph are computed, and nodes are merged if the BDDs have already been computed or the new BDDs are stored on a heap if their size is less than an upper size limit. The foregoing steps are performed until the BDD size has reached a lower limit value. After the lower limit is reached, the circuit is analyzed using a satisfiability analysis algorithm to check for equivalence or non-equivalence of the first and second circuit, controlled by a back-track limit. Then, the limit value is raised and the BDD computations are repeated for the new limit. The back-track limit is also raised and the structural satisfiability solver is called with the new back-track limit.

The invention may further be embodied in a workstation computer executing program instructions for carrying out the steps of the method, and in a computer program product having a storage media for those program instructions.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like numbers correspond to like elements and further:

DETAILED DESCRIPTION OF ILLUSTRATIVE EMBODIMENT

Figure 1:
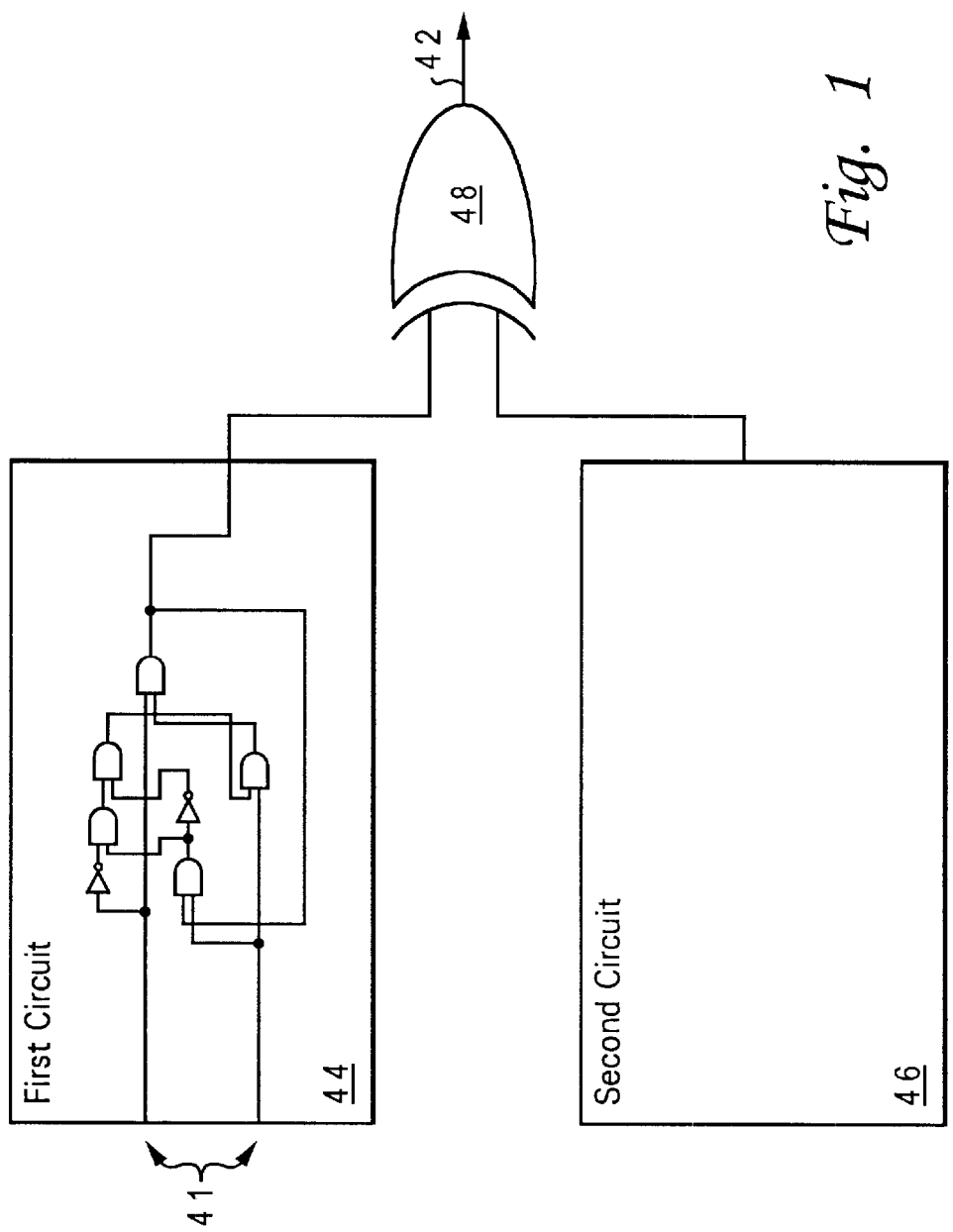
FIG. 1 is a high-level schematic diagram of the circuit model in accordance with an embodiment of the present invention.

With reference now to the figures, and particularly to FIG. 1, a circuit model used in the present invention is depicted. In order to verify equivalence of two circuits, a model may be constructed as shown in FIG. 1.

A first circuit 44 and a second circuit 46 are coupled by an xor gate 48 to produce an output 42. Output 42 represents an error function. That is, if output 42 is ever in a logic "1" state for any logic combination of inputs 41, first circuit 44 and second circuit 46 are not equivalent. This combined circuit allows the use of Binary Decision Diagram (BDD) analysis to be performed which will merge nodes within the combined circuit. Before BDD analysis is performed, the circuit is represented as a combination of AND gates and inverters, producing a circuit representation that is easy to process and can be reduced initially through a structural hashing scheme such as that described in the above incorporated patent. Portions of the circuit can be selected through cut-point analysis and Automatic Test Pattern Generation (ATPG) simulations.

In a verification analysis, the circuits to be compared are usually identical, with the exception of errors. Assuming this is true, it is likely that many or all of the internal circuit paths will be common. In this situation, the merging of nodes will quickly reduce the analysis time.

Figure 2A:
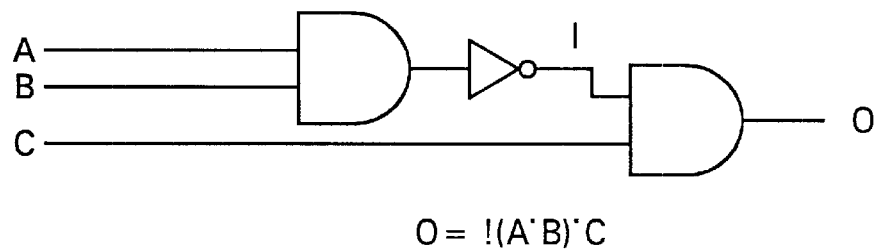
FIG. 2A is a schematic diagram of a circuit that can be analyzed in accordance with a preferred method of the present invention.
Figure 2B:
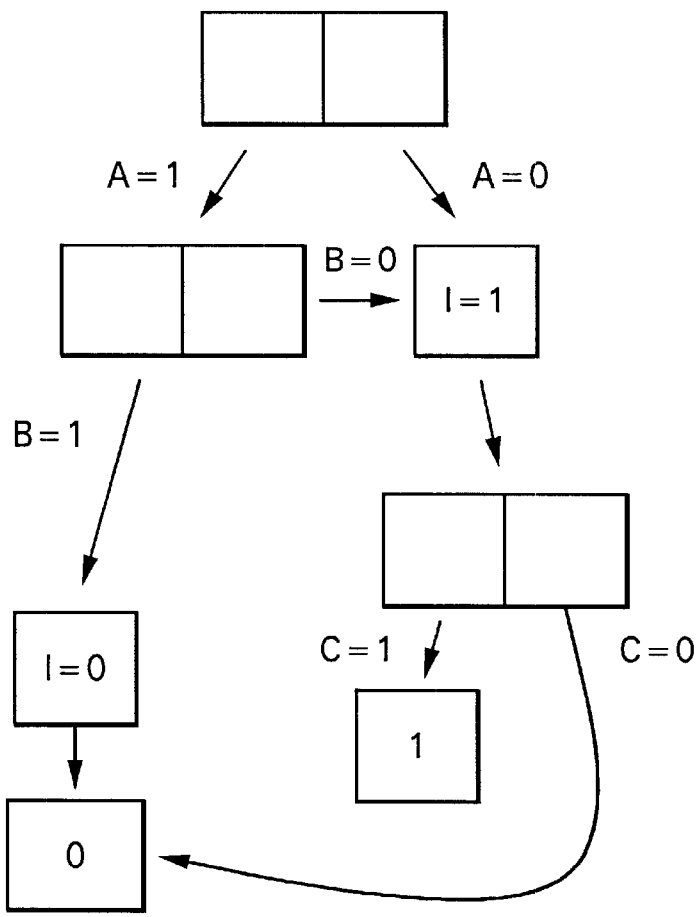
FIG. 2B is a binary decision diagram modeling the circuit of FIG. 2A in accordance with a preferred method of the present invention.

Referring now to FIG. 2A, a circuit is shown which implements the boolean function O=!(A·B)·C. FIG. 2B depicts a BDD model of the circuit of FIG. 2A. Starting with a first input, for each possible state of the circuit inputs, a decision tree is built that terminates in either another decision based on another input or terminates in a determined logic state. The decision tree's termination in a determined logic state indicates for the particular combination of variables at the decision point and above, no other downstream variables can affect the logical outcome. This BDD is a canonical representation of the circuit in that the BDD represents any circuit that implements the boolean function O=!(A·B)·C.

The circuit of FIG. 2A is a small, simple circuit. As the number of nodes and inputs in the circuit being analyzed increases, the size of the BDD required to represent the circuit increases. In the worst case the relationship is exponential. The present invention enables BDD analysis to be performed on much larger circuits than has been possible up to this point. By performing the BDD analysis on the input of the combined circuit of FIG. 1, and terminating the BDD analysis when the BDD size reaches a predetermined limit, a satisfiability (SAT) solver can be performed to verify the equivalence of first circuit 44 and second circuit 46. The SAT solver backtracks due to contradictions created by assigning logical values to selected nodes and assigns boolean terms based on those assignments. If the SAT solver is able to find an assignment of values to all nodes in the network such that XOR gate 48 output is a logic zero, the equivalence of the two circuits is established.

If the SAT solver is unable to verify within a predetermined backtrack limit, the BDD size limit used in the BDD analysis is increased and the BDD operations are performed again for all the nodes in the combined circuit, further compressing the combined circuit.

Figure 3:
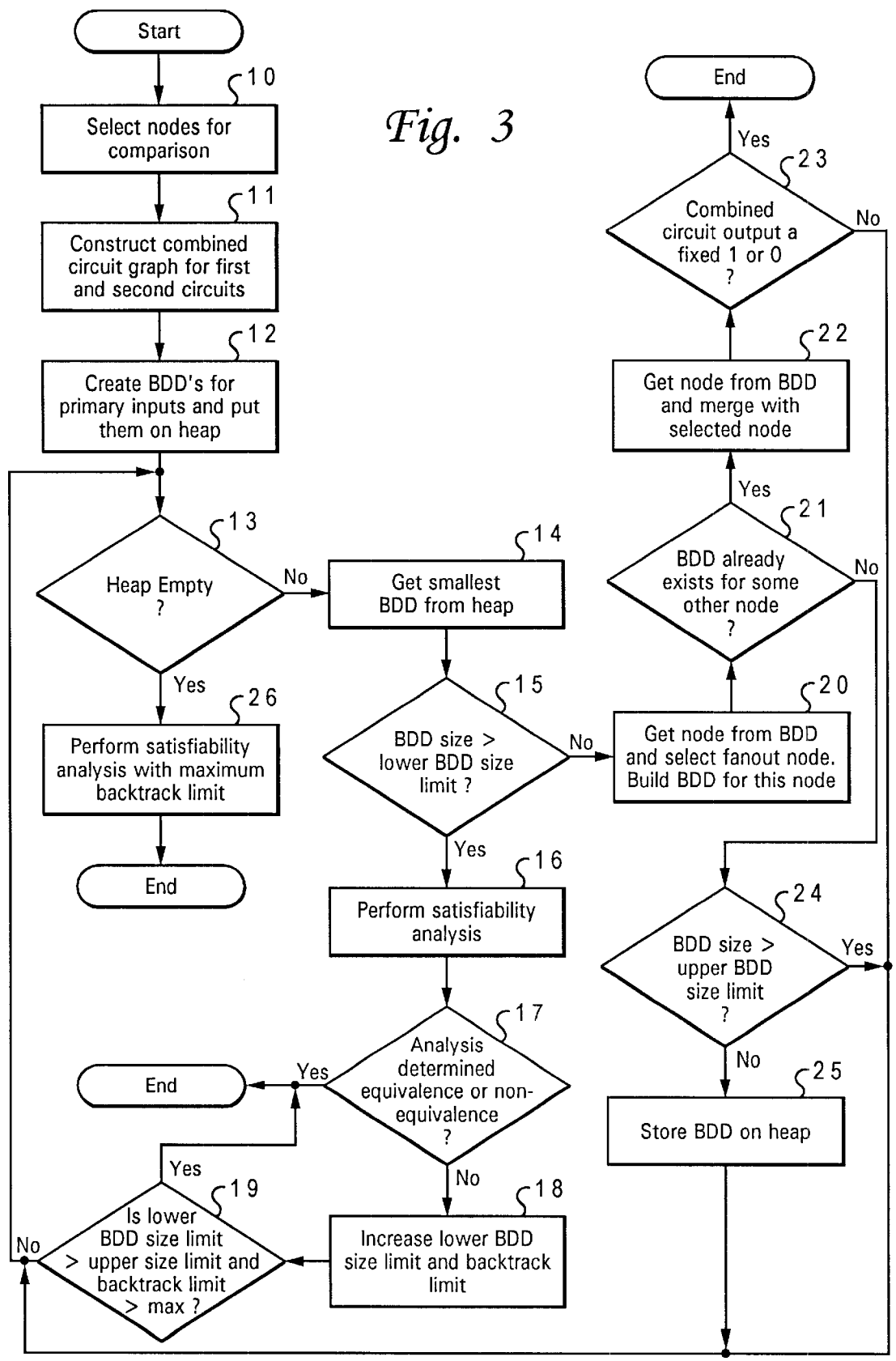
FIG. 3 is a flow chart depicting an embodiment of a preferred method of the present invention.

Referring now to FIG. 3, a preferred method of the present invention is depicted in a flow diagram. A pair of circuit nodes from the two circuits to be compared is selected for analysis (step 10) and a combined circuit graph is constructed for the two nodes (step 11). Next, BDD's are constructed for all of the primary inputs and placed on a heap (step 12). If there are no BDD's present on the heap (decision 13), the process terminates. Otherwise, BDD's are retrieved from the heap starting with the smallest BDD (step 14). While the BDD size is less than the lower limit (decision 15), the BDD analysis proceeds to select fanout nodes and building BDD's for this node (step 20). If the BDD has already been computed (decision 21), the node is retrieved and the selected node is merged with the retrieved node, since they are equivalent (step 22). The circuit is checked to see if the output of the combined circuit is now a fixed logical "1" or "0" (decision 23), and if so, the process terminates. A logical "1" corresponds to proof of non-equivalence, a logic "0" to proof of equivalence. If the BDD is not already present on the heap (decision 21), and if it is smaller than the upper BDD size limit (decision 24), then it is added to the heap (step 25).

When there are no BDD's on the heap with a size less than or equal to the lower BDD size limit (decision 15), a satisfiability analysis is performed (step 16). Then, unless the satisfiability analysis itself proves equivalence or non-equivalence (decision 17), the lower BDD size limit and the backtrack depth for the SAT solver are increased and the BDD analysis/SAT solver steps are re-performed from step 14 until the upper BDD size limit is exceeded, or the heap is exhausted (Decision 19). When the BDD analysis terminates for the combined circuit formed by the selected first and second circuit, if the BDD heap is exhausted and the equivalence of the first circuit 44 and second circuit 46 has not been proven, the SAT solver can be called with the maximum backtrack limit in an attempt to "brute force" a result. If the SAT solver fails to prove equivalence, the verification of the combined circuit returns an undecided result. At this point the process can be repeated for another pair of nodes selected in step 10.

Figure 4:
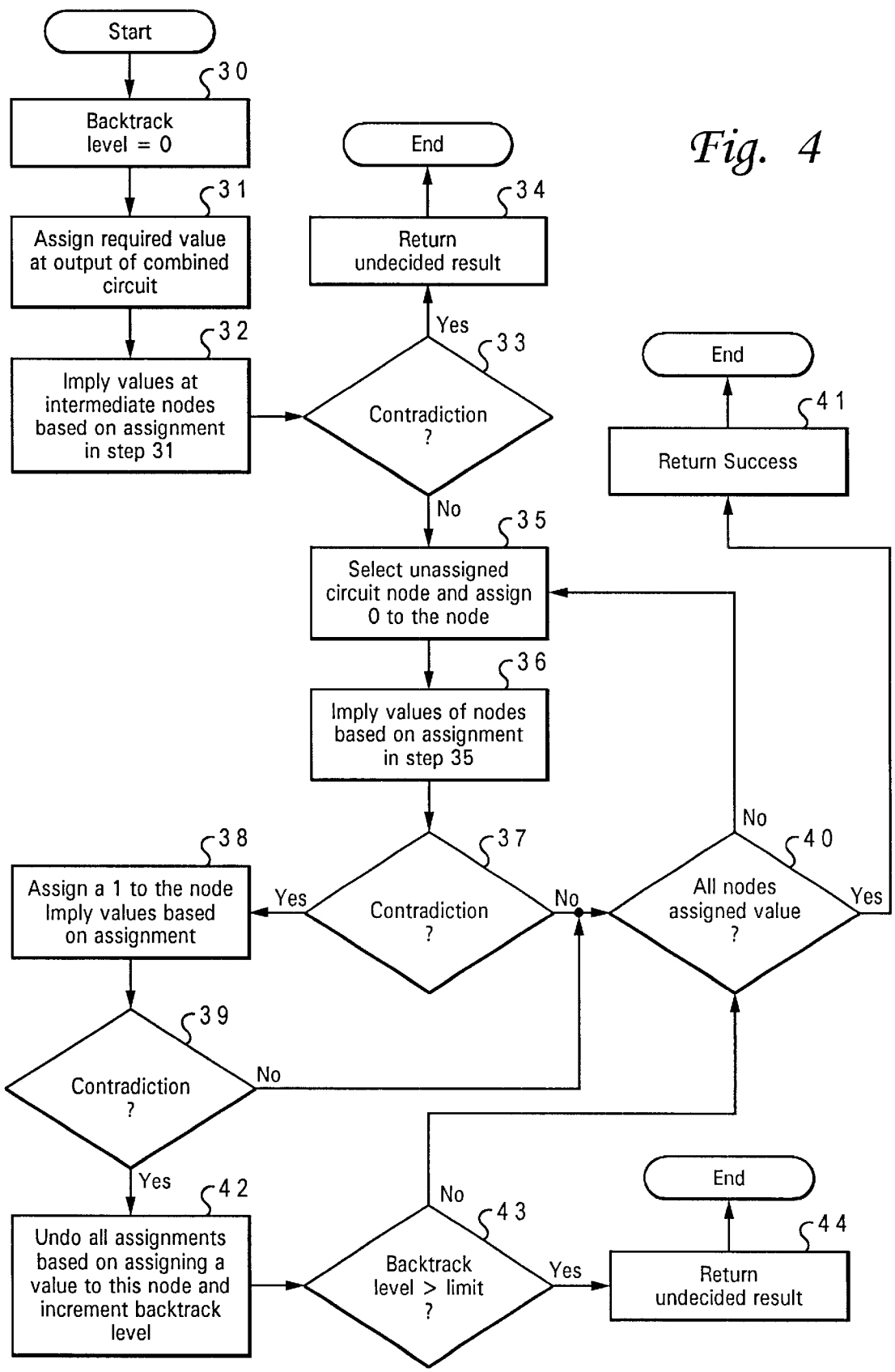
FIG. 4 is a flow chart depicting a satisfiability algorithm in accordance with an embodiment of the method of the present invention.

Referring now to FIG. 4, the operation of the SAT solver of Step 17 is shown. Starting with a backtrack level of zero (step 30), the state of the output is set to a required value (step 31). Intermediate nodes are set to implied values based on the assignment in step 32. The values at the nodes are checked for a contradiction (decision 33) and if any node value is in conflict, a failure is returned (step 34). If there is no contradiction (decision 33), an unassigned circuit node is selected and set to a zero state (step 35). The values of nodes based on the assignment are then implied in the boolean clauses that form the node equation and those clauses that depend on the node (step 36) and the values of the nodes are checked for contradiction (decision 37). If there is no contradiction, the next unassigned node is assigned (step 35) if all nodes have not been assigned (decision 40), if all nodes have been assigned, then the SAT checking was successful and the algorithm terminates returning success (step 41). If a conflict is detected in decision 37, a logical one value is now assigned to the selected node and the values based upon that node assignment are implied (step 38) and the values of the nodes are again checked for conflict (decision 39), if there is no contradiction, the algorithm proceeds to the next node (step 35) if all the nodes have not been assigned (decision 40). If there is again a contradiction in decision 39, all assignments based on setting a value at this node are undone and the backtrack level is incremented (step 42). If the backtrack level exceeds the backtrack limit (step 43), the algorithm returns an undecided result. This will cause another iteration of the BDD heap processing loop in FIG. 3. (Decision 17 results in a "NO" result).

As the processes described by FIG. 3 and FIG. 4, proceed, the BDD algorithm progressively merges equivalent nodes on a macroscopic scale, up to a set BDD size. Then the SAT solver attempts to prove equivalence within a set backtrack range (which limits the amount of time the SAT solved will require before returning). The BDD size and SAT backtrack limit are progressively increased until equivalence is proven, or the upper limit is met. If the upper limit is met without proving equivalence, returning an undecided result, the SAT solver can be used with a large backtrack limit, or some alternative technique can be used to produce a solution.

The method of the present invention may be implemented by a workstation computer executing a sequence of program instructions for carrying out the steps of the method and may be embodied in a computer program product comprising media storing the program instructions.

Figure 5:
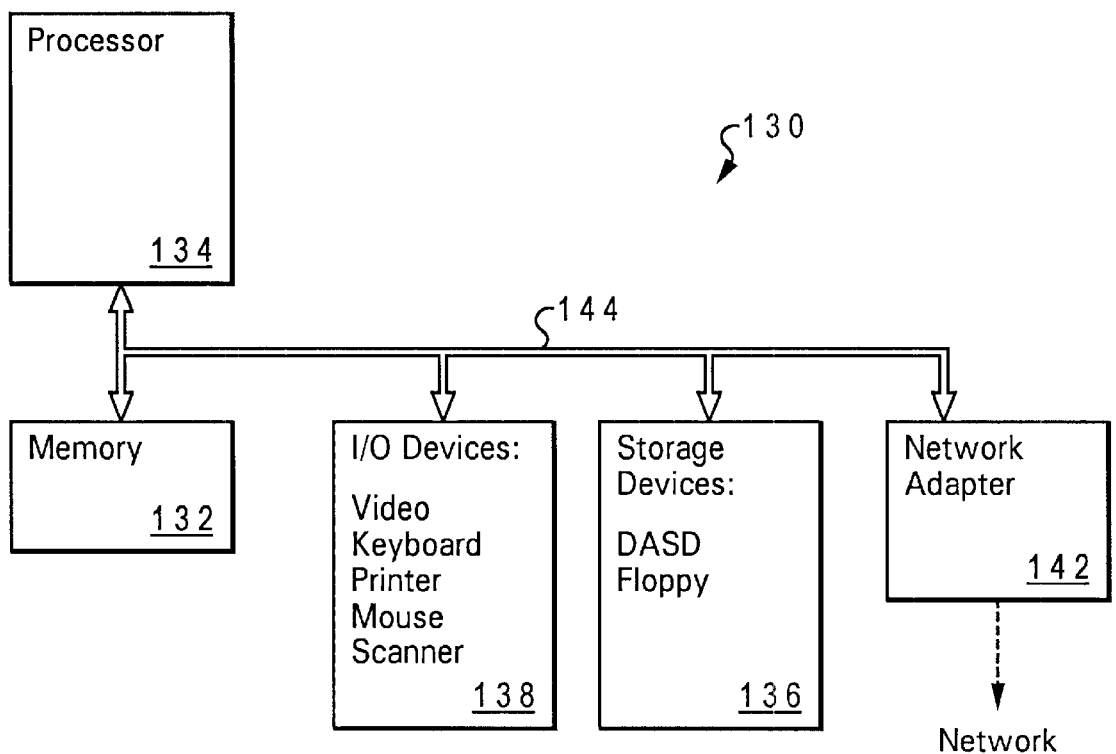
FIG. 5 is a block diagram of a workstation in which the present invention can be incorporated.

Referring now to FIG. 5, an organization of components within the workstation 130 in which the present invention may be incorporated is shown. A processor 134 executes sequences of program instructions stored in a memory 132, coupled to processor by a bus 144. The program instructions in memory are typically loaded from storage devices 136 such as Direct Access Storage Devices (hard discs) or floppy discs, that are coupled to bus 144. The program instructions may also be loaded from a network via network adapter 142. I/O devices such as video displays, printers, keyboards, mice and scanners are coupled through electrical or other interfaces to bus 144 for providing user input and output.

The user interaction associated with the present invention is of a kind generally associated with verification, simulation or design software used in conjunction with the manufacture or programming of integrated circuits containing logical circuits, although they may contain other types of circuits in combination. The circuits are generally very-large-scale integrated circuits(VLSI)comprising metal oxide semiconductor (MOS) devices. But, the techniques of the present invention apply to logical networks in general and the invention should be understood to contemplate the used of the method with other forms of circuits that have been developed and may be developed.

Although the invention has been described with reference to specific embodiments, this description should not be construed in a limiting sense. Various modifications of the disclosed embodiments, as well as alternative embodiments of the invention, will become apparent to persons skilled in the art upon reference to the description of the invention. For example, the techniques of the present invention could be adapted to verify other logical structures such as field programmable logic arrays. It is therefore contemplated that such modifications can be made without departing from the spirit or scope of the present invention as defined in the appended claims.

What is claimed is:

1. A method for comparing a first logical circuit to a second logical circuit, comprising the steps of:
   constructing a combined circuit graph representing said first circuit and said second circuit, wherein said combined circuit graph includes a plurality of nodes;
   computing a binary decision diagram (BDD) for one of said plurality of nodes within said combined circuit graph;
   merging said node if said BDD is already present on a heap;
   storing said BDD on said heap if said BDD is not already present on said heap;
   determining whether or not a size of a smallest BDD on said heap has exceeded a predetermined lower size limit;
   in response to a determination that said size of said smallest BDD has not exceeded said predetermined lower size limit, repeating said steps of computing, merging, storing and determining; and
   in response to a determination that said size of said heap has exceeded said predetermined lower size limit, analyzing said first circuit and said second circuit using a satisfiability analysis to detect conflicts between values that can be assumed by said plurality of nodes.

2. The method of claim 1, wherein said satisfiability analysis is a back-tracking search, and said analyzing step comprises performing said back-tracking search up to a predetermined back-track level limit.

3. The method of claim 2, wherein said method further comprises the step of responsive to said performing step, increasing said predetermined lower size limit.

4. The method of claim 3, wherein said method further comprises the step of responsive to said increasing step, re-performing said steps of computing, merging, storing, determining and repeating.

5. The method of claim 3, wherein said increasing step further increases said predetermined back-track level limit.

6. The method of claim 5, wherein said method further comprises the step of responsive to said increasing step, re-performing said steps of computing, merging, storing and determining and repeating.

7. The method of claim 1, wherein said analyzing step uses a satisfiability analysis algorithm comprising the steps of:
   assigning a value to a first node of said combined circuit;
   locating non-contradictory assignments for other nodes in said combined circuit at a particular backtrack level from said first node by
   implying said assignments at said other nodes;
   determining whether or not a contradiction is present between said value and said assignments based on the functional logic of said combined circuit;
   responsive to a determination that there is contradiction, altering said assignments and checking for contradiction; and
   responsive to a determination that there is no contradiction for a complete set of assignments, returning an equivalence result.

8. A computer program product for use with a design workstation, wherein said computer program product comprises signal bearing media containing program instructions for execution on said workstation for comparing a first logical circuit to a second logical circuit by performing the steps of:
   constructing a combined circuit graph representing said first circuit and said second circuit, wherein said combined circuit graph includes a plurality of nodes;
   computing a binary decision diagram (BDD) for one of said plurality of nodes within said combined circuit graph;
   merging said node if said BDD is already present on a heap;
   storing said BDD on said heap if said BDD is not already present on said heap;
   determining whether or not a size of a smallest BDD on said heap has exceeded a predetermined lower size limit;
   in response to a determination that said size of said smallest BDD has not exceeded said predetermined lower size limit, repeating said steps of computing, merging, storing and determining; and
   in response to a determination that said size of said heap has exceeded said predetermined lower size limit, analyzing said first circuit and said second circuit using a satisfiability analysis to detect conflicts between values that can be assumed by said plurality of nodes.

9. The computer program product of claim 8, wherein said program instructions for performing said analyzing step comprise instructions for performing a back-tracking search and said back-tracking search is performed up to a back-track level limit.

10. The computer program product of claim 9, wherein said program instructions further comprise instructions for increasing said predetermined lower size limit, responsive to said performing step being completed.

11. The computer program product of claim 10, wherein said program instructions further comprise instructions for re-performing said steps of computing, merging, storing, determining and repeating.

12. The computer program product of claim 10, further comprising program instructions for increasing said back-track level limit, responsive to said performing step.

13. The computer program product of claim 12, further comprising program instructions for re-performing said steps of computing, merging, storing, determining and repeating.

14. The computer program product of claim 8, wherein said program instructions for performing said analyzing step comprise instructions for performing the steps of:

assigning a value to a first node of said combined circuit;

locating non-contradictory assignments for other nodes in said combined circuit at a particular backtrack level from said first node by implying said assignments at said other nodes;

determining whether or not a contradiction is present between said value and said assignments based on the functional logic of said combined circuit;

responsive to a determination that there is contradiction, altering said assignments and checking for contradiction; and responsive to a determination that there is no contradiction for a complete set of assignments, returning an equivalence result.

15. A workstation comprising:

a memory subsystem for storing operands and data;

means for processing a series of program instructions for comparing a first logical circuit to a second logical circuit by performing the steps of:

constructing a combined circuit graph representing said first circuit and said second circuit, wherein said combined circuit graph includes a plurality of nodes;

computing a binary decision diagram (BDD) for one of said plurality of nodes within said combined circuit graph;

merging said node if said BDD is already present on a heap;

storing said BDD on said heap if said BDD is not already present on said heap;

determining whether or not a size of a smallest BDD on said heap has exceeded a predetermined lower size limit;

in response to a determination that said size of said smallest BDD has not exceeded said predetermined lower size limit, repeating said steps of computing, merging, storing and determining; and in response to a determination that said size of said heap has exceeded said predetermined lower size limit, analyzing said first circuit and said second circuit using a satisfiability analysis to detect conflicts between values that can be assumed by said plurality of nodes.

16. The workstation of claim 15, wherein said program instructions for performing said analyzing step comprise instructions for performing a back-tracking search.

17. The workstation of claim 16, wherein said program instructions further comprise instructions for increasing said predetermined lower size limit, responsive to said performing step being completed.

18. The workstation of claim 17, wherein said program instructions further comprise instructions for re-performing said steps of computing, merging, storing, determining and repeating.

19. The workstation of claim 17, further comprising program instructions for increasing said back-track level limit, responsive to said performing step.

20. The workstation of claim 19, further comprising program instructions for re-performing said steps of computing, merging, storing, determining and repeating.

21. The workstation system of claim 15, wherein said program instructions for performing said analyzing step comprise instructions for performing the steps of:

assigning a value to a first node of said combined circuit;

locating non-contradictory assignments for other nodes in said combined circuit at a particular backtrack level from said first node by implying said assignments at said other nodes;

determining whether or not a contradiction is present between said value and said assignments based on the functional logic of said combined circuit;

responsive to a determination that there is contradiction, altering said assignments and checking for contradiction; and responsive to a determination that there is no contradiction for a complete set of assignments, returning an equivalence result.

\* \* \* \* \*